(12) United States Patent
Aitken et al.

(10) Patent No.: US 7,262,466 B2
(45) Date of Patent: Aug. 28, 2007

(54) STRAINED SEMICONDUCTOR-ON-INSULATOR STRUCTURES AND METHODS FOR MAKING STRAINED SEMICONDUCTOR-ON-INSULATOR STRUCTURES

(75) Inventors: Bruce Gardiner Aitken, Corning, NY (US); Kishor Purushottam Gadkaree, Big Flats, NY (US); Matthew John Dejneka, Corning, NY (US); Linda Ruth Pinckney, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 11/196,866

(22) Filed: Aug. 3, 2005

(65) Prior Publication Data

US 2006/0038227 A1 Feb. 23, 2006

Related U.S. Application Data

(60) Provisional application No. 60/602,782, filed on Aug. 18, 2004.

(51) Int. Cl.
*H01L 27/01* (2006.01)
(52) U.S. Cl. .............. 257/347; 438/311; 438/455; 438/458
(58) Field of Classification Search ........... 428/426; 438/311, 455, 458; 257/347
See application file for complete search history.

(56) References Cited

U.S. PATENT DOCUMENTS

| | | | |
|---|---|---|---|
| 5,374,564 A | 12/1994 | Bruel | 437/24 |
| 5,442,205 A | 8/1995 | Brasen et al. | 257/191 |
| 5,854,123 A | 12/1998 | Sato et al. | 438/507 |
| 5,968,857 A | 10/1999 | Pinckney | 501/10 |
| 6,010,579 A * | 1/2000 | Henley et al. | 148/33.2 |
| 6,107,653 A | 8/2000 | Fitzgerald | 257/191 |
| 6,140,209 A | 10/2000 | Iwane et al. | 438/458 |
| 6,211,041 B1 | 4/2001 | Ogura | 438/458 |
| 6,248,678 B1 | 6/2001 | Pinckney | 501/10 |
| 6,309,950 B1 | 10/2001 | Forbes | 438/455 |
| 6,323,108 B1 | 11/2001 | Kub et al. | 438/458 |
| 6,328,904 B1 * | 12/2001 | Hattori et al. | 216/11 |
| 6,335,231 B1 | 1/2002 | Yamazaki et al. | 438/151 |
| 6,391,740 B1 | 5/2002 | Cheung et al. | 438/455 |
| 6,539,641 B2 | 4/2003 | Belliveau | 33/526 |
| 6,573,126 B2 | 6/2003 | Cheng et al. | 438/149 |
| 6,809,380 B2 * | 10/2004 | Matsuhashi | 257/347 |
| 6,825,909 B2 * | 11/2004 | Walker et al. | 349/158 |
| 6,987,028 B2 * | 1/2006 | Ravi | 438/26 |
| 6,991,944 B2 * | 1/2006 | Rayssac et al. | 438/13 |

(Continued)

OTHER PUBLICATIONS

Shoji, Shuichi, et al., "Low-temperature anodic bonding using lithium aluminosilicate-beta-quarts glass ceramic," Sensors and Actuators A 64 (1998) 95-100.*

(Continued)

*Primary Examiner*—Sara Crane
(74) *Attorney, Agent, or Firm*—Timothy M. Schaeberle

(57) ABSTRACT

The present invention relates to semiconductor-on-insulator structures having strained semiconductor layers. According to one embodiment of the invention, a semiconductor-on-insulator structure has a first layer including a semiconductor material, attached to a second layer including a glass or glass-ceramic, with the CTEs of the semiconductor and glass or glass-ceramic selected such that the first layer is under tensile strain. The present invention also relates to methods for making strained semiconductor-on-insulator layers.

42 Claims, 4 Drawing Sheets

U.S. PATENT DOCUMENTS 7,053,361 B2 * 5/2006 Mitamura et al. ..... 250/231.13
7,098,085 B2 * 8/2006 Yamanaka et al. .......... 438/149

OTHER PUBLICATIONS

Bister et al, "Ranges of the 0.3-2 MeV $H^+$ and 0.7-2 MeV $H_2+$ Ions in Si and Ge," *Radiation Effects*, 1982, 59:199-202.

M. Bruel, *Electronic Lett*. 31, 1995 pp. 1201-1202.

D.B. Marshall and A.G. Evans, "Measurement of Adherence of Residually Stressed Films By Indentation. I. Mechanics of Interface Delimitation", J. Appl. Phys, 56{10} 2632-2638 (1984).

L. Dicioccio, Y. Letiec, F. Letertre, C. Jaussad and M. Bruel, *Electronic Lett*. 32, 1996, pp. 1144-1145.

* cited by examiner

STRAINED SEMICONDUCTOR-ON-INSULATOR STRUCTURES AND METHODS FOR MAKING STRAINED SEMICONDUCTOR-ON-INSULATOR STRUCTURES

This application claims priority from provisional application 60/602,782, filed Aug. 18, 2004.

BACKGROUND OF THE INVENTION

1. Field of the Invention

The present invention relates generally to semiconductor structures, and more particularly to semiconductor-on-insulator structures and methods for making semiconductor-on-insulator structures.

To date, the semiconductor material most commonly used in semiconductor-on-insulator structures has been silicon. Such structures have been referred to in the literature as silicon-on-insulator structures and the abbreviation "SOI" has been applied to such structures. The present invention relates to semiconductor-on-insulator structures in general, including silicon-on-insulator structures.

For ease of presentation, the following discussion will at times be in terms of silicon-on-insulator structures. The references to this particular type of semiconductor-on-insulator structure are made to facilitate the explanation of the invention and are not intended to, and should not be interpreted as, limiting the invention's scope in any way.

The SOI abbreviation is used herein to refer to semiconductor-on-insulator structures in general, including, but not limited to, silicon-on-insulator structures. Similarly, the SOG abbreviation is used to refer to semiconductor-on-glass structures in general, including, but not limited to, silicon-on-glass structures. The SOG nomenclature is also intended to include semiconductor-on-glass-ceramic structures, including, but not limited to, silicon-on-glass-ceramic structures. The abbreviation SOI encompasses SOGs.

2. Technical Background

Silicon-on-insulator technology is becoming increasingly important for high performance thin film transistors, solar cells, and displays, such as, active matrix displays. The silicon-on-insulator wafers consist of a thin layer of substantially single crystal silicon (generally 0.1-0.3 microns in thickness but, in some cases, as thick as 5 microns) on an insulating material.

Various ways of obtaining such a wafer include epitaxial growth of Si on lattice matched substrates; bonding of a single crystal silicon wafer to another silicon wafer on which an oxide layer of $SiO_2$ has been grown, followed by polishing or etching of the top wafer down to, for example, a 0.1 to 0.3 micron layer of single crystal silicon; or ion-implantation methods in which either hydrogen or oxygen ions are implanted either to form a buried oxide layer in the silicon wafer topped by Si in the case of oxygen ion implantation or to separate (exfoliate) a thin Si layer to bond to another Si wafer with an oxide layer as in the case of hydrogen ion implantation. Of these three approaches, the approaches based on ion implantation have been found to be more practical commercially. In particular, the hydrogen ion implantation method has an advantage over the oxygen implantation process in that the implantation energies required are less than 50% of that of oxygen ion implants and the dosage required is two orders of magnitude lower.

Exfoliation by the hydrogen ion implantation method was initially taught in, for example, Bister et al., "Ranges of the 0.3-2 MeV $H^+$ and 0.7-2 MeV $H_2^+$ Ions in Si and Ge," *Radiation Effects*, 1982, 59:199-202, and has been further demonstrated by Michel Bruel. See Bruel, U.S. Pat. No. 5,374,564; M. Bruel, *Electronic Lett.* 31, 1995 pp 1201-1202; and L. Dicioccio, Y. Letiec, F. Letertre, C. Jaussad and M. Bruel, *Electronic Lett.* 32, 1996, pp 1144-1145. Each of the above-referenced publications are hereby incorporated herein by reference. The method typically consists of the following steps. A thermal oxide layer is grown on a single crystal silicon wafer. Hydrogen ions are then implanted into this wafer to generate subsurface flaws. The implantation energy determines the depth at which the flaws are generated and the dosage determines flaw density. This wafer is then placed into contact with another silicon wafer (the support substrate) at room temperature to form a tentative bond. The wafers are then heat-treated to about 600° C. to cause growth of the subsurface flaws for use in separating a thin layer of silicon from the Si wafer. The resulting assembly is then heated to a temperature above 1,000° C. to fully bond the Si film with $SiO_2$ underlayer to the support substrate, i.e., the unimplanted Si wafer. This process thus forms a silicon-on-insulator structure with a thin film of silicon bonded to another silicon wafer with an oxide insulator layer in between.

Cost is an important consideration for commercial applications of SOI structures. To date, a major part of the cost of such structures has been the cost of the silicon wafer which supports the oxide layer, topped by the Si thin film, i.e., a major part of the cost has been the support substrate. Although the use of quartz as a support substrate has been mentioned in various patents (see U.S. Pat. Nos. 6,140,209; 6,211,041; 6,309,950; 6,323,108; 6,335,231; and 6,391,740), quartz is itself a relatively expensive material. In discussing support substrates, some of the above references have mentioned quartz glass, glass, and glass-ceramics. Other support substrate materials listed in these references include diamond, sapphire, silicon carbide, silicon nitride, ceramics, metals, and plastics.

As the present inventors discovered, it is not at all a simple matter to replace a silicon wafer with a wafer made out of a less expensive material in an SOI structure. In particular, it is difficult to replace a silicon wafer with a glass or glass-ceramic of the type which can be manufactured in large quantities at low cost, i.e., it is difficult to make cost effective SOG structures. This is so because prior to the present invention, the art has not had practical techniques for using glass or glass-ceramics as support substrates in semiconductor-on-insulator structures.

The "strained silicon effect" has been used to obtain higher electron mobilities and hole mobilities in silicon-based semiconductor materials. As described in U.S. Pat. Nos. 6,107,653 and 6,539,641, strained silicon films have been grown by depositing SiGe layers of gradually increasing Ge concentration onto a silicon wafer, then a silicon layer is formed on the topmost SiGe layer. The thermal expansion mismatch between the SiGe layer and the silicon layer puts the silicon layer under tensile stress. In the strained silicon layer, electrons experience less resistance and flow up to 70 percent faster than in unstrained silicon, leading to microelectronics devices that are up to 35% faster than comparably-sized devices made in unstrained silicon. However, the cost of strained silicon substrates can be high, because prior to the present invention, the art has not had practical techniques for making semiconductor-on-insulator structures having a strained semiconductor layer and glass or glass-ceramics as the support substrate.

SUMMARY OF THE INVENTION

One embodiment of the present invention relates to a semiconductor-on-insulator structure including first and second layers which are attached to one another either directly or through one or more intermediate layers, wherein the first layer includes a substantially single crystal semiconductor material; the second layer includes a glass or a glass-ceramic; and the CTE(25-300° C.) of the glass or glass-ceramic is less positive than the CTE(25° C.) of the semiconductor material.

Another embodiment of the present invention relates to a semiconductor-on-insulator structure including first and second layers which are attached to one another either directly or through one or more intermediate layers, wherein the first layer comprises a substantially single crystal semiconductor material; the second layer comprises a glass or a glass-ceramic; wherein the semiconductor-on-insulator structure has a use temperature $T_{use}$; and wherein $$\int_{T_{use}}^{T_{bond}} CTE_{first\ layer}(T) - CTE_{second\ layer}(T)\, dT$$

is greater than zero.

Another embodiment of the present invention relates to A method for producing a semiconductor-on-insulator structure comprising:

(A) providing first and second substrates wherein:
  (1) the first substrate comprises a first external surface for bonding to the second substrate (the first bonding surface), a second external surface for applying force to the first substrate (the first force-applying surface), and an internal zone for separating the first substrate into a first part and a second part (the separation zone), wherein:
    (a) the first bonding surface, the first force-applying surface, and the separation zone are substantially parallel to one another;
    (b) the second part is between the separation zone and the first bonding surface; and
    (c) the first substrate comprises a substantially single-crystal semiconductor material; and
  (2) the second substrate comprises two external surfaces, one for bonding to the first substrate (the second bonding surface) and another for applying force to the second substrate (the second force-applying surface), wherein:
    (a) the second bonding surface and the second force-applying surface are substantially parallel to one another and are separated from one another by a distance $D_2$; and
    (b) the second substrate comprises a glass or a glass-ceramic;
(B) bringing the first and second bonding surfaces into contact;
(C) for a period of time sufficient for the first and second substrates to bond to one another at the first and second bonding surfaces, simultaneously:
  (1) applying force to the first and second force-applying surfaces to press the first and second bonding surfaces together;
  (2) subjecting the first and second substrates to an electric field which is characterized by first and second voltages $V_1$ and $V_2$ at the first and second force-applying surfaces, respectively, said voltages being uniform at those surfaces with $V_1$ being higher than $V_2$ so that the electric field is directed from the first substrate to the second substrate; and
  (3) heating the first and second substrates, said heating being characterized by first and second temperatures $T_1$ and $T_2$ at the first and second force-applying surfaces, respectively, said temperatures being uniform at those surfaces and being selected so that upon cooling to a common temperature, the first and second substrates undergo differential contraction to thereby weaken the first substrate at the separation zone; and
(D) cooling the bonded first and second substrates and separating the first and second parts at the separation zone, wherein $T_1$, $T_2$, the CTE of the semiconductor material and the CTE of the glass or glass-ceramic material are chosen such that the semiconductor material is under tensile strain at 25° C.

The semiconductor-on-insulator structures and methods for making semiconductor-on-insulator structures of the present invention result in a number of advantages over prior art. The present invention satisfies the long-standing need in the art for lower cost substrates for strained SOI structures. In addition, the invention provides novel forms for such structures. Among the numerous applications for the invention are those in such fields as optoelectronics, RF electronics, and mixed signal (analog/digital) electronics, as well as display applications, e.g., LCDs and OLEDs, where significantly enhanced performance can be achieved compared to amorphous silicon, polysilicon and unstrained silicon based devices. In addition, photovoltaics and solar cells with high efficiency are also enabled. Both the invention's novel processing techniques and its novel strained SOI structures significantly lower the cost of a strained SOI structure and thus satisfy the continuing demand in the semiconductor field for lower cost strained semiconductor devices.

Additional features and advantages of the invention will be set forth in the detailed description which follows, and in part will be readily apparent to those skilled in the art from the description or recognized by practicing the invention as described in the written description and claims hereof, as well as in the appended drawings.

It is to be understood that both the foregoing general description and the following detailed description are merely exemplary of the invention, and are intended to provide an overview or framework for understanding the nature and character of the invention as it is claimed.

The accompanying drawings are included to provide a further understanding of the invention, and are incorporated in and constitute a part of this specification. The drawings are not necessarily to scale, and sizes of various elements may be distorted for clarity. The drawings illustrate one or more embodiment(s) of the invention, and together with the description serve to explain the principles and operation of the invention.

DETAILED DESCRIPTION OF THE PREFERRED EMBODIMENTS

Figure 1:
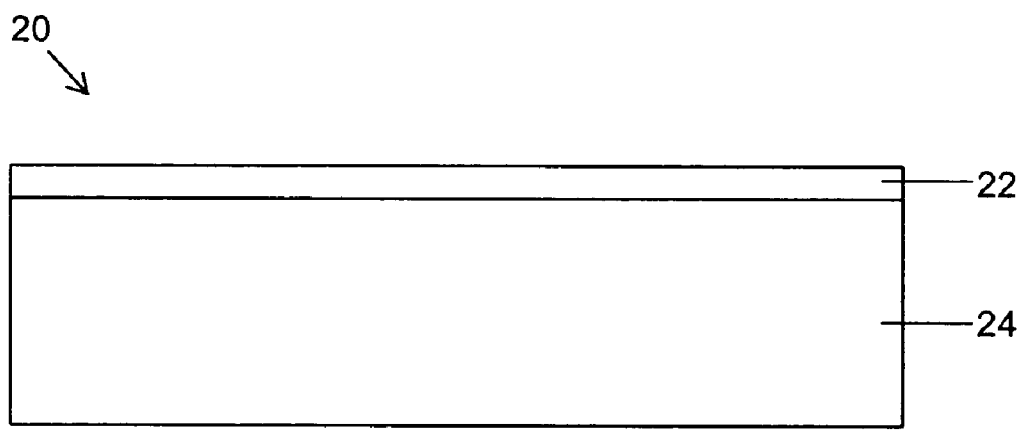
FIG. 1 is a schematic cross-sectional view of a semiconductor-on-insulator structure according to one embodiment of the present invention.

One embodiment of the present invention is shown in schematic cross-sectional view in FIG. 1. A semiconductor-on-insulator structure 20 includes a first layer 22, and a second layer 24. First layer 22 and second layer 24 are attached to one another either directly, as shown in FIG. 1, or through one or more intermediate layers. If there are one or more intermediate layers intervening between first layer 22 and second layer 24, then first layer 22 and second layer 24 are desirably separated by no more than about 100 nm in distance. First layer 22 is formed from a substantially single-crystal semiconductor material, and second layer 24 is formed from a glass or a glass-ceramic. The coefficient of thermal expansion (CTE) over the 25-300° C. temperature range (hereinafter CTE(25-300° C.)) of the glass or the glass ceramic is less positive than the CTE at 25° C. (hereinafter CTE(25° C.)) of the semiconductor material. The CTE(25-300° C.) of the glass or glass-ceramic can be positive, or can even be negative (e.g., for β-eucryptite-based glass-ceramics). CTE(25-300° C.) values are reported as an average CTE value over the temperature range.

Desirably, the CTE(25-300° C.) of the glass or glass-ceramic is at least $3\times10^{-7}$/° C. less positive than the CTE (25° C.) of the semiconductor material. More desirably, the CTE(25-300° C.) of the glass or glass-ceramic is at least $5\times10^{-7}$/° C. less positive than the CTE(25° C.) of the semiconductor material. In certain desirable embodiments of the invention, the CTE(25-300° C.) of the glass or glass-ceramic is at least $7\times10^{-7}$/° C. less positive, or even $10\times10^{-7}$/° C. less positive than the CTE(25° C.) of the semiconductor material. In order to prevent failure or delamination of the first layer, it may be desirable for the difference between the CTE(25° C.) of the semiconductor material and the CTE(25-300° C.) of the glass or glass-ceramic to be no greater than about $30\times10^{-7}$/° C.

The CTEs of the materials described herein are reported as the CTE of the homogeneous material itself, and not as the actual expansion behavior of the layers of materials in the actual semiconductor-on-insulator structures of the present invention. Since the first and second layers are attached to one another, and are generally rigid materials, their expansion and contraction behavior will be affected by the other layer(s) to which they are attached. If there is a difference in CTE between the materials of the first and second layer, and the layers are attached to one another at an elevated temperature $T_{bond}$, one of the layers will experience tension and the other compression upon cooling to room temperature. The phrases "seeks to contract," "differential contraction upon cooling to a common temperature," and similar phrases are used herein to reflect the fact that the contraction of the substrates when cooling from $T_{bond}$ will in general be different than their non-bonded contraction, e.g., the layer having the more positive CTE discussed may seek to contract to a certain extent as a result of the cooling, but may not (and in general will not) actually contract to that extent as a result of being bonded to the layer having the less positive CTE.

In certain embodiments of the invention (e.g., when the semiconductor material is a silicon-based semiconductor material), the CTE(25-300° C.) of the glass or glass-ceramic is no more positive than about $22\times10^{-7}$/° C. In these certain embodiments of the invention, the glass or glass-ceramic desirably has a CTE(25-300° C.) of no more positive than about $20\times10^{-7}$/° C., no more positive than $18\times10^{-7}$/° C., or even no more positive than $15\times10^{-7}$/° C. In certain desirable embodiments of the invention, the glass or glass-ceramic has a strain point of less than 1050° C.

In desirable embodiments of the invention, the semiconductor material is under tensile strain. For example, in the embodiment shown in FIG. 1, the first layer is desirably under tensile strain at a use temperature of the semiconductor-on-insulator structure (e.g., 25° C., 100° C., or over the 25-100° C. temperature range). Tensile strain can improve the electron and hole mobility properties of the semiconductor material, thereby allowing the construction of devices with improved properties. For example, the first layer desirably has a bulk mobility that is at least about 105% of the bulk mobility of that of the semiconductor material in a substantially unstrained state. More desirably, the first layer has a bulk mobility that is at least about 120% of the bulk mobility of that of the semiconductor material in a substantially unstrained state. Strained semiconductors are discussed in more detail in U.S. Pat. Nos. 5,442,205; 6,107,653; 6,573,126; and 6,593,641, each of which is hereby incorporated herein by reference in its entirety.

The semiconductor material can be a silicon-based semiconductor material, or can be any other suitable type of semiconductor material, such as a III-V semiconductor, a II-IV semiconductor, a II-IV-V semiconductor, or a IV semiconductor. Examples of silicon-based semiconductor materials suitable for use as the semiconductor material of the first layer include silicon (e.g., undoped silicon, n-doped silicon, p-doped silicon); germanium-doped silicon (SiGe); and silicon carbide (SiC). Examples of other semiconductor materials which can be used in the first layer include Ge—, GeAs—, GaP—, and InP-based materials. The first layer can have virtually any suitable thickness. For example, the first layer can be up to about 1 μm in thickness, and is desirably between about 10 nm and about 500 nm, with the thickness range of about 10 nm to about 150 nm being especially desirable. The semiconductor material of the first layer can have a wide range of CTEs depending on the material. For example, the semiconductor material of the first layer can have a CTE(25° C.) between about $20\times10^{-7}$/° C. and about $70\times10^{-7}$/° C.

The semiconductor material of the first layer is in the form of a substantially single-crystal material. The word "substantially" is used in describing the first layer to take account of the fact that semiconductor materials normally contain at least some internal or surface defects either inherently or purposely added, such as lattice defects or a few grain boundaries. The word "substantially" also reflects the fact that certain dopants may distort or otherwise affect the crystal structure of the bulk semiconductor material.

The glass or glass-ceramic of the second layer is desirably a silica-based glass or glass-ceramic. Desirably, $SiO_2$ is present in the glass or glass-ceramic at a concentration of at least about 30 mol %. More desirably, $SiO_2$ is present in a concentration of at least about 40 mol %. Glass-ceramics suitable for use in the present invention can include any crystalline phase, such as mullite, cordierite, spinel, β-quartz, or β-spodumene. In certain desirable embodiments of the invention, the crystalline phase of the glass-ceramic of the second layer is spinel, β-quartz, or β-spodumene. The glass phase of the glass-ceramic is desirably sufficient to allow movement of positive ions away from the interface between the first and second layers during step (C) of the below-described method for making semiconductor-on-insulator structures.

Non-silica-based glasses and glass-ceramics can be used in the practice of the invention, but are generally less desirable because of their higher cost and/or inferior performance characteristics. In certain desirable embodiments of the invention (for example, in silicon-on-insulator structures), the glass or glass ceramic is desirably an oxide glass or oxide glass ceramic. However, for some applications, e.g., for SOI structures employing semiconductor materials that are not silicon-based, second layers which are not oxide-based, e.g., non-oxide glasses, may be desirable, but are generally of higher cost.

For certain applications, e.g., display applications, the glass or glass-ceramic is desirably substantially transparent in the visible, near UV, and/or near IR wavelength ranges. For example, the glass or glass-ceramic is desirably substantially transparent in the 350 nm to 2 μm wavelength range.

The glass or glass-ceramic of the second layer can be produced from conventional raw materials using a variety of techniques familiar to the skilled artisan, and can be attached to the first layer using the methods described herein below, and in U.S. patent application Ser. No. 10/779,582, entitled "GLASS-BASED SOI STRUCTURES", which is hereby incorporated herein by reference in its entirety.

In certain embodiments of the invention, the glass or glass-ceramic desirably includes at least some positive ions which during step (C) of the method described herein below and in U.S. patent application Ser. No. 10/779,582 move in the direction of the applied electric field, i.e., away from the interface between the bonded first and second layers and toward the back side of the second layer. Alkali ions, e.g., $Li^+$, $Na^+$, and/or $K^+$ ions, are suitable positive ions for this purpose because they generally have higher mobilities than other types of positive ions typically incorporated in glasses and glass-ceramics. However, glasses and glass-ceramics having no alkali ions can be used in the present invention. For example, glasses and glass-ceramics having other mobile ions, such as alkaline-earth ions (e.g., $Ca^{2+}$, $Mg^{2+}$, $Ba^{2+}$, $Sr^{2+}$) or other positive ions such as $Ag^+$, $Cu^+$, $Zn^{2+}$ and various transition metal ions can be used in the second layer in the semiconductor-on-insulator structures of the present invention, although the latter set of ions may undesirably decrease optical transmission, especially in the UV.

In embodiments of the invention in which the glass or glass-ceramic contains alkali or alkaline-earth ions, the concentrations of alkali and alkaline-earth ions can vary over a wide range, representative concentrations being between 0.1 and 40 wt % on an oxide basis. Desirable alkali and alkaline-earth ion concentrations are 0.1-10 wt % on an oxide basis in the case of alkali ions, and 0-25 wt % on an oxide basis in the case of alkaline-earth ions. Many nominally alkali-free glasses have tens to hundreds of ppm of alkali contaminant, which can move during step (C) of the method described herein below.

Although substrates composed of a single glass or glass-ceramic are preferred, laminated structures can be used if desired. When laminated structures are used, the layer of the laminate closest to the first layer should have the properties discussed herein for a second layer composed of a single glass or glass-ceramic material. Layers farther from the first layer preferably also have those properties, but may have relaxed properties because they do not directly interact with the first substrate. In the latter case, the second layer is considered to have ended when the properties specified for the second layer are no longer satisfied.

Along these same lines, there may be intermediate layers between the first layer and the second layer. For example, in the bonding process described herein below, either or both of the first substrate and the second substrate can include surface layers over all or part of their external surfaces, e.g., an oxide layer on the semiconductor. When present, such surface layers should not have a composition and/or a thickness which will prevent the formation of a strong bond between the first and second layers. In particular, an oxide layer on the semiconductor substrate having a thickness greater than about 100 nm can lead to weak or no bonding with the glass or glass-ceramic substrate. If there are one or more intermediate layers between the first layer and the second layer, they desirably have a combined thickness of less than about 100 nm. The combined thickness of any intermediate layers is more desirably less than about 50 nm, and even more desirably less than about 30 nm.

Although not wishing to be bound by any particular theory of operation, it is believed that an oxide layer having a greater thickness provides a high resistance to current flow and thus diminishes the electrolysis-type reaction at the interface between the first and second substrates which is believed to provide the desired strong bond in the methods described herein below. Accordingly, when an oxide layer is present on the bonding surface of the first substrate, it should function primarily as a passivation layer, as opposed to an insulating layer. Likewise, any oxide layer formed on the bonding surface of the second substrate should not interfere with current flow and thus will desirably have a thickness of less than about 100 nm. When surface layers are present on the bonding surfaces of the first and second substrates, they become intermediate layers between the first and second layers of the semiconductor-on-insulator structure.

Desirable glass families for use as the glass in the present invention include aluminosilicate glasses, borosilicate glasses, aluminoborosilicate glasses, and rare earth aluminosilicate glasses. Examples of suitable low-expansion glass compositions are given below in mol % in Tables 1 and 2, below. The skilled artisan can make these and other suitable glass compositions using standard methods. For example, the glasses listed below can be made by mixing the component oxide, halide (e.g., $AlCl_3$), phosphate (e.g., $Al(PO_3)_3$ or $AlPO_4$) and/or carbonate ($CaCO_3$) powders in a ball mill for 1 hour to make a 1 kg batch. The mixed batch can then be loaded into a Pt crucible and melted in a 1650° C. globar furnace overnight, after which time the melted glass can be poured onto a steel plate and annealed between 850° C. and 950° C. to alleviate stress. The properties of these glasses can be tailored by the skilled artisan by modifying the composition. For example, the CTE can be increased by lowering the $SiO_2$ content or increasing the rare earth oxide content. The strain point can be increased by increasing the $SiO_2$ content and the ration of $Al_2O_3$ to $RE_2O_3$ (RE=rare earth), as well as by changing the identity of $RE_2O_3$. For example, replacing $La_2O_3$ with $Y_2O_3$ will increase the strain point and decrease the CTE. The skilled artisan can add small amounts (e.g., up to a few percent) alkali or alkaline-earth ions to the alkali and alkaline-earth ion-free compositions listed below in order to obtain glasses more suitable for use in the bonding methods described herein below.

TABLE 1

| Example | SiO$_2$ | Al$_2$O$_3$ | Al$_2$Cl$_6$ | CaO | La$_2$O$_3$ | Y$_2$O$_3$ | TiO$_2$ | P$_2$O$_5$ | Strain Point (° C.) | Anneal Temp (° C.) | CTE(25-300° C.) (×10$^{-7}$/° C.) |
|---|---|---|---|---|---|---|---|---|---|---|---|
| 1A | 78 | 15.4 | 0 | 0 | 2.6 | 0 | 0 | 4 | 837 | 894 | 18 |
| 1B | 79.62 | 7.47 | 0.12 | 12.80 | 0 | 0 | 0 | 0 | 783 | 835 | 33 |
| 1C | 81.23 | 8.34 | 0.12 | 9.82 | 0.20 | 0.29 | 0 | 0 | 808 | 863 | 30 |
| 1D | 82.92 | 9.26 | 0.12 | 6.71 | 0.41 | 0.58 | 0 | 0 | 826 | 883 | 27 |
| 1E | 84.70 | 10.22 | 0.13 | 3.44 | 0.62 | 0.90 | 0 | 0 | 840 | 900 | 19 |
| 1F | 86.57 | 11.22 | 0.13 | 0 | 0.85 | 1.23 | 0 | 0 | 908 | 982 | 15 |
| 1G | 86.24 | 11.18 | 0.13 | 0 | 0 | 2.45 | 0 | 0 | 914 | 994 | 16 |
| 1H | 86.89 | 11.27 | 0.13 | 0 | 1.71 | 0 | 0 | 0 | 896 | 966 | 15 |
| 1I | 89.98 | 7.44 | 0.12 | 0 | 0.81 | 0 | 1.65 | 0 | 887 | 964 | 11 |
| 1J | 89.70 | 7.41 | 0.12 | 0 | 0.71 | 0 | 2.06 | 0 | 890 | 965 | 9 |
| 1K | 76 | 12.1 | 0.5 | 11.4 | 0 | 0 | 0 | 0 | 812 | 867 | 32 |
| 1L | 75.75 | 13.2 | 0.5 | 8.55 | 1 | 1 | 0 | 0 | 804 | 858 | 32 |
| 1M | 75.5 | 14.3 | 0.5 | 5.7 | 2 | 2 | 0 | 0 | 808 | 859 | 31 |
| 1N | 75.25 | 15.4 | 0.5 | 2.85 | 3 | 3 | 0 | 0 | 819 | 867 | 30 |
| 1O | 75 | 16.5 | 0.5 | 0 | 4 | 4 | 0 | 0 | 831 | 876 | 32 |
| 1P | 75 | 16.5 | 0.5 | 0 | 8 | 0 | 0 | 0 | 812 | 860 | 36 |
| 1Q | 82 | 11.5 | 0.5 | 0 | 4 | 0 | 2 | 0 | 867 | 929 | 22 |
| 1R | 82 | 11.5 | 0.5 | 0 | 3.5 | 0 | 2.5 | 0 | 876 | 943 | 22 |
| 1S | 80 | 10.5 | 0.5 | 9 | 0 | 0 | 0 | 0 | 818 | 875 | 26 |
| 1T | 80 | 12.5 | 0.5 | 4.5 | 1.25 | 1.25 | 0 | 0 | 820 | 870 | 28 |
| 1U | 80 | 13.5 | 0.5 | 2.25 | 1.875 | 1.875 | 0 | 0 | 830 | 881 | 25 |
| 1V | 80 | 14.5 | 0.5 | 0 | 2.5 | 2.5 | 0 | 0 | 854 | 905 | 26 |
| 1W | 81 | 10.75 | 0.5 | 6.75 | 0.5 | 0.5 | 0 | 0 | 814 | 869 | 26 |
| 1X | 82 | 11 | 0.5 | 4.5 | 1 | 1 | 0 | 0 | 820 | 876 | 24 |
| 1Y | 83 | 11.25 | 0.5 | 2.25 | 1.5 | 1.5 | 0 | 0 | 843 | 901 | 22 |
| 1X | 84 | 11.5 | 0.5 | 0 | 2 | 2 | 0 | 0 | 893 | 959 | 22 |

TABLE 2

| Example | SiO$_2$ | Al$_2$O$_3$ | La$_2$O$_3$ | Y$_2$O$_3$ | SrO | Na$_2$O | SnO$_2$ | Liquidus Temp (° C.) | CTE(25-300° C.) (×10$^{-7}$/° C.) |
|---|---|---|---|---|---|---|---|---|---|
| 2A | 82 | 12.6 | 4.9 | 0.5 | 0 | 0.5 | 0 | 1450 | — |
| 2B | 80 | 14 | 3 | 3 | 0 | 0.5 | 0 | 1450 | — |
| 2C | 80 | 14 | 2.75 | 2.75 | 1 | 0 | 0 | 1480 | — |
| 2D | 80 | 14 | 3 | 3 | 0 | 0 | 0 | 1470 | 29 |
| 2E | 84 | 11.2 | 4.3 | 0 | 0.5 | 0 | 0.5 | 1490 | — |

Another type of glass suitable for use as the second layer in the semiconductor-on-insulator structures of the present invention is an aluminum phosphorus silicate glass. Simple ternary compositions (such as those of Examples 3A-3C in Table 3, below) tend to have the lowest coefficients of thermal expansion and high strain points. However, should the expansion mismatch between the simple ternary compositions and the semiconductor material be too large (e.g., so large that they cause failure or delamination of the strained semiconductor layer), it is possible to provide higher CTE glasses by adding one or more modifying components to the simple ternary glass. Typical modifying components include alkali and alkaline earth oxides (e.g., Na$_2$O, Li$_2$O, BaO, CaO), as well as ZnO, Y$_2$O$_3$, La$_2$O$_3$, Ga$_2$O$_3$, TiO$_2$, ZrO$_2$, HfO$_2$, GeO$_2$, SnO$_2$, Nb$_2$O5 and Ta$_2$O$_5$. Components such as BaO, Y$_2$O$_3$ and La$_2$O$_3$ are particularly desirable modifiers, as they result in an increase in the CTE without a large reduction in the strain point of the glass.

Examples of modified glasses are shown as Examples 3D-N of Table 3, below. The skilled artisan can use conventional melting and forming processes to provide aluminum phosphorus silicate glasses for use in the present invention, and can add small amounts (e.g., up to a few percent) alkali or alkaline-earth ions to the alkali and alkaline-earth ion-free compositions listed below in order to obtain glasses more suitable for use in the bonding methods described herein below. For example, aluminum phosporus silicate glasses can be melted in Pt crucibles at 1650° C. using as raw materials a mixture of silica, alumina, aluminum metaphosphate (or orthophosphate) and any modifier as the appropriate oxide or carbonate. Glasses are typically annealed at about 900° C. Aluminum phosphorus silicate glasses are described in more detail in U.S. Provisional patent application Ser. No. 60/533,765, entitled "High Strain Point Glasses," which is hereby incorporated herein by reference in its entirety.

TABLE 3

| Example | Al$_2$O$_3$ | P$_2$O$_5$ | SiO$_2$ | BaO | Y$_2$O$_3$ | La$_2$O$_3$ | ZrO$_2$ | Na$_2$O | Strain Point (° C.) | CTE (25-300° C.) (×10$^{-7}$/° C.) |
|---|---|---|---|---|---|---|---|---|---|---|
| 3A | 23 | 7 | 70 | 0 | 0 | 0 | 0 | 0 | 864 | 10.1 |
| 3B | 22 | 9 | 69 | 0 | 0 | 0 | 0 | 0 | 875 | 8.6 |
| 3C | 23 | 8 | 69 | 0 | 0 | 0 | 0 | 0 | 860 | 10.1 |

TABLE 3-continued

| Example | Al$_2$O$_3$ | P$_2$O$_5$ | SiO$_2$ | BaO | Y$_2$O$_3$ | La$_2$O$_3$ | ZrO$_2$ | Na$_2$O | Strain Point (° C.) | CTE (25-300° C.) (×10$^{-7}$/° C.) |
|---|---|---|---|---|---|---|---|---|---|---|
| 3D | 21.9 | 7.6 | 65.5 | 5 | 0 | 0 | 0 | 0 | 824 | 20.6 |
| 3E | 21.3 | 7.4 | 63.8 | 7.5 | 0 | 0 | 0 | 0 | 812 | 27.9 |
| 3F | 22.4 | 7.8 | 67.3 | 0 | 2.5 | 0 | 0 | 0 | 856 | 16.7 |
| 3G | 21.9 | 7.6 | 65.5 | 0 | 5 | 0 | 0 | 0 | 841 | 22.3 |
| 3H | 21.3 | 7.4 | 63.8 | 0 | 7.5 | 0 | 0 | 0 | 834 | 27.9 |
| 3I | 21.9 | 7.6 | 65.5 | 0 | 2.5 | 0 | 2.5 | 0 | 846 | 18.2 |
| 3J | 21.9 | 7.6 | 65.5 | 0 | 3.7 | 0 | 1.3 | 0 | 836 | 18.8 |
| 3K | 22.4 | 7.8 | 67.3 | 0 | 0 | 2.5 | 0 | 0 | 840 | 17.0 |
| 3L | 21.9 | 7.6 | 65.6 | 0 | 0 | 5 | 0 | 0 | 824 | 23.5 |
| 3M | 21.9 | 7.6 | 65.6 | 0 | 0 | 2.5 | 2.5 | 0 | 829 | 19.6 |
| 3N | 21.8 | 7.92 | 64.4 | 0 | 0 | 0 | 0 | 0.99 | 819 | 18.9 |

Glass-ceramic materials suitable for use in the present invention can be found in a number of composition families, including those based on crystals of spinel, β-quartz, and β-spodumene. Glass-ceramics suitable for use in the present invention may be based on other crystalline phases, such as mullite, cordierite, and β-eucryptite. Examples of such compositions are shown in Table 4, and are described in U.S. Pat. Nos. 5,968,857 and 6,248,678, each of which is hereby incorporated herein by reference in its entirety. Other glass-ceramic materials having low or even negative CTEs (e.g., based on β-eucryptite or β-quartz, such as lithium alumino-silicate β-quartz glass-ceramics) and appropriate strain points may also be used in the present invention. Glass-ceramic materials having low expansion can be made using methods familiar to the skilled artisan. Although most glass-ceramics have some alkali or alkaline earth ions, any known low-expansion alkali- and alkaline-earth-free glass-ceramics can be modified with a small amount of alkali or alkaline-earth ions in order to provide glass-ceramic materials more suitable for use in the bonding methods described herein below.

perature of the interface at which the first layer and the second layer become attached to one another. The bonding temperature will be between $T_1$ and $T_2$, and may be approximated as the average of $T_1$ and $T_2$, or may be determined by thermal modeling or measurement as would be apparent to the skilled artisan. In order to put the first layer under strain at the use temperature, the first layer must seek to contract more as a result of cooling from the bonding temperature $T_{bond}$ to the use temperature. As such, according to one embodiment of the invention, the CTEs of the materials of the first layer and of the second layer are such that $$\int_{T_{use}}^{T_{bond}} CTE_{first\ layer}(T) - CTE_{second\ layer}(T)\,dT$$

is greater than zero. Desirably,

TABLE 4

| Composition (wt %) | Example 4A | Example 4B | Example 4C | Example 4D | Example 4E |
|---|---|---|---|---|---|
| SiO$_2$ | 71.6 | 68.8 | 68.8 | 68.8 | 70.7 |
| Al$_2$O$_3$ | 12.7 | 19.2 | 19.2 | 19.2 | 22.1 |
| ZnO | 4.4 | 1.0 | 1.0 | 1.0 | 0 |
| MgO | 2.1 | 1.8 | 1.8 | 1.8 | 0 |
| BaO | 1.2 | 0.8 | 0.8 | 0.8 | 0 |
| Li$_2$O | 0 | 2.7 | 2.7 | 2.7 | 4.0 |
| Na$_2$O | 0 | 0 | 0 | 0 | 2.0 |
| K$_2$O | 0 | 0 | 0 | 0 | 1.2 |
| TiO$_2$ | 5.0 | 2.7 | 2.7 | 2.7 | 2.8 |
| ZrO$_2$ | 3.0 | 1.8 | 1.8 | 1.8 | 1.6 |
| Heat Treatment | 1000° C., 2 h | 920° C., 0.5 h | 1050° C., 0.5 h | 1100° C., 0.5 h | 850° C., 2 h |
| Crystal Phase | spinel | β-quartz | β-quartz + β-spodumene | β-spodumene | β-quartz |
| CTE(25-300° C.) (×10$^{-7}$/° C.) | 25 | 4.7 | 7.8 | 7.9 | 24 |
| Strain Point (° C.) | 938 | 870 | 1001 | 1018 | not measured |

The tensile strain of the first layer at a given use temperature will depend strongly upon the difference in the temperature between the bonding temperature and the use temperature, as well as on the relative CTEs as a function of temperature of the materials of the first layer and the second layer. As used herein, the bonding temperature is the tem- $$\int_{T_{use}}^{T_{bond}} CTE_{first\ layer}(T) - CTE_{second\ layer}(T)\,dT$$

is greater than about $1 \times 10^{-4}$. More desirably, $$\int_{T_{use}}^{T_{bond}} CTE_{first\ layer}(T) - CTE_{second\ layer}(T)\,dT$$

is greater than about $2\times10^{-4}$. In certain especially desirable embodiments of the invention, $$\int_{T_{use}}^{T_{bond}} CTE_{first\ layer}(T) - CTE_{second\ layer}(T)\,dT$$

is greater than about $5\times10^{-4}$. Desirably, the semiconductor-on-insulator structure has the above-recited values of $$\int_{T_{use}}^{T_{bond}} CTE_{first\ layer}(T) - CTE_{second\ layer}(T)\,dT$$

over a use temperature range of 25-100° C. For example, according to one embodiment of the invention, a semiconductor-on-insulator structure has the above-recited values of $$\int_{T_{use}}^{T_{bond}} CTE_{first\ layer}(T) - CTE_{second\ layer}(T)\,dT$$

at a use temperature $T_{use}$ of 25° C. According to another embodiment of the invention, a semiconductor-on-insulator structure has the above-recited values of $$\int_{T_{use}}^{T_{bond}} CTE_{first\ layer}(T) - CTE_{second\ layer}(T)\,dT$$

at a use temperature of 100° C.

As will be appreciated by the skilled artisan, the strength of the bond between the glass or glass ceramic and the semiconductor layer attached thereto is a key property of a semiconductor-on-insulator structure. High bond strength and durability are very important to ensure that the semiconductor-on-insulator structure can withstand the processing associated with the manufacture of thin film transistors and other devices within or on the structure. The bond strength between the first layer and the second layer is desirably at least 8 J/m². More desirably, the bond strength between the first layer and the second layer is at least 10 J/m². In certain especially desirable embodiments of the invention, the bond strength between the first layer and the second layer is at least 15 J/m². Bond energies can be determined using indentation measurements, which can be performed using a Nano Indenter II (MTS Systems Corporation, Eden Prairie, Minn.) equipped with a Berkovich diamond indenter. As the skilled artisan will appreciate, other equipment can be used to perform indentation measurements. Indentations are to be made covering a range of loads, and the region immediately surrounding the indentation is to be examined for evidence of delamination. Calculation of bond energy is made in accordance with D. B. Marshall and A. G. Evans, "Measurement of Adherence of Residually Stressed Films by Indentation. I. Mechanics of Interface Delamination", J. Appl. Phys, 56[10] 2632-2638 (1984), the relevant portions of which are hereby incorporated herein by reference. Further details of the bond energy determination can be found in U.S. patent application Ser. No. 10/779,582.

Figure 2:
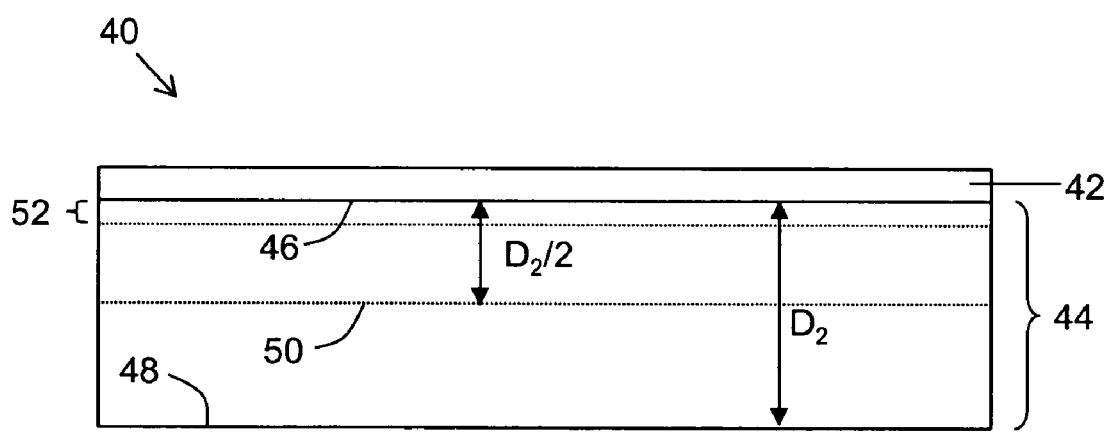
FIG. 2 is a schematic cross-sectional view of a semiconductor-on-insulator structure having a positive ion depletion region according to another embodiment of the present invention.

Another embodiment of the invention is shown in schematic cross-sectional view in FIG. 2. A semiconductor-on-insulator structure 40 includes a first layer 42 and a second layer 44, substantially as described above for the embodiment of FIG. 1. The second layer 44 has a first face 46, and a second face 48 separated by a distance $D_2$, the first face 46 being substantially parallel to the second face, and closer to the first layer 42 than the second face 48. The faces are described as being "substantially parallel" in order to account for the fact that there might be some slight angle (e.g., up to a few degrees) between them. The phrase "substantially parallel" also includes the possibility that one or more of the faces may not be completely flat. The second layer 44 also includes a reference surface 50, which is within the second layer 44, is substantially parallel to the first face 46, and is separated from the first face 46 by a distance $D_2/2$. The second layer 44 includes positive ions of one or more types, each type of positive ion having a reference concentration $C_{i/Ref}$ at the reference surface 50. The second layer also has a positive ion depletion region 52, which begins at the first face and extends toward the reference surface, in which the concentration of at least one type of positive ion is depleted relative to the reference concentration $C_{i/Ref}$. The depleted ion may be a mobile positive ion, for example, an alkali ion or an alkaline-earth ion. The positive ion depletion region can be formed in the methods described herein below and in U.S. patent application Ser. No. 10/779,582 by the motion of the positive ions during step (C).

Figure 3:
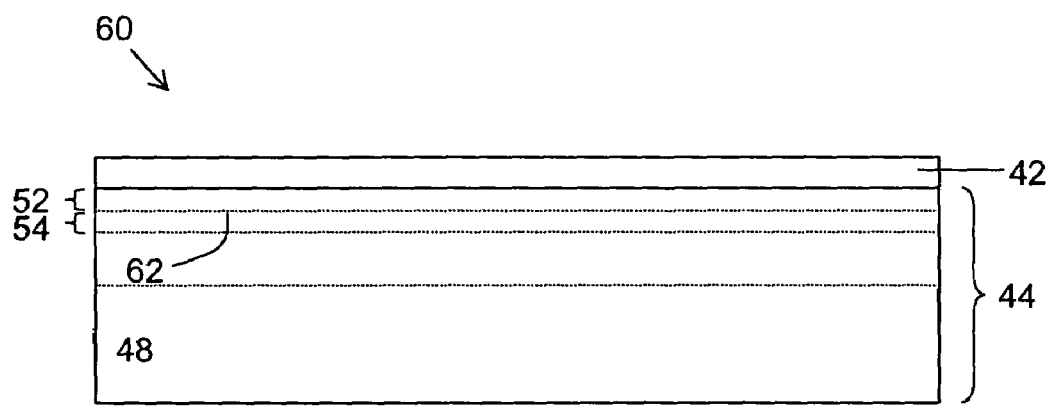
FIG. 3 is a schematic cross-sectional view of a semiconductor-on-insulator structure having a pile-up region according to another embodiment of the present invention.

According to another embodiment of the invention, shown in schematic cross-sectional view in FIG. 3, the positive ion depletion region 52 of a semiconductor-on-insulator structure 60 (substantially as described above with respect to FIG. 2) has a distal edge 62. The second layer 44 further includes a pile-up region 54 in the vicinity of the distal edge 62. In the pile-up region 54, the concentration of at least one type of positive ion is enhanced relative to $C_{i/Ref}$ for that ion. The enhanced ion may be, for example, a mobile ion such as an alkali ion or an alkaline-earth ion, and is desirably the same as the depleted ion of the positive ion depletion region 52. The pile-up region can be formed in the methods described herein below and in U.S. patent application Ser. No. 10/779,582 by the motion of the positive ions during step (C).

Figure 4:
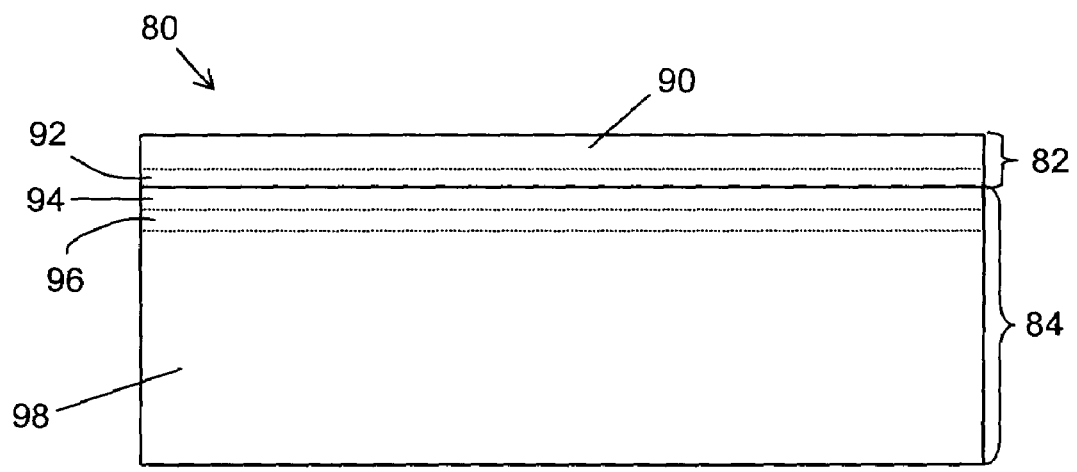
FIG. 4 is a schematic cross-sectional view of a semiconductor-on-insulator structure according to another embodiment of the present invention.
Figure 5:
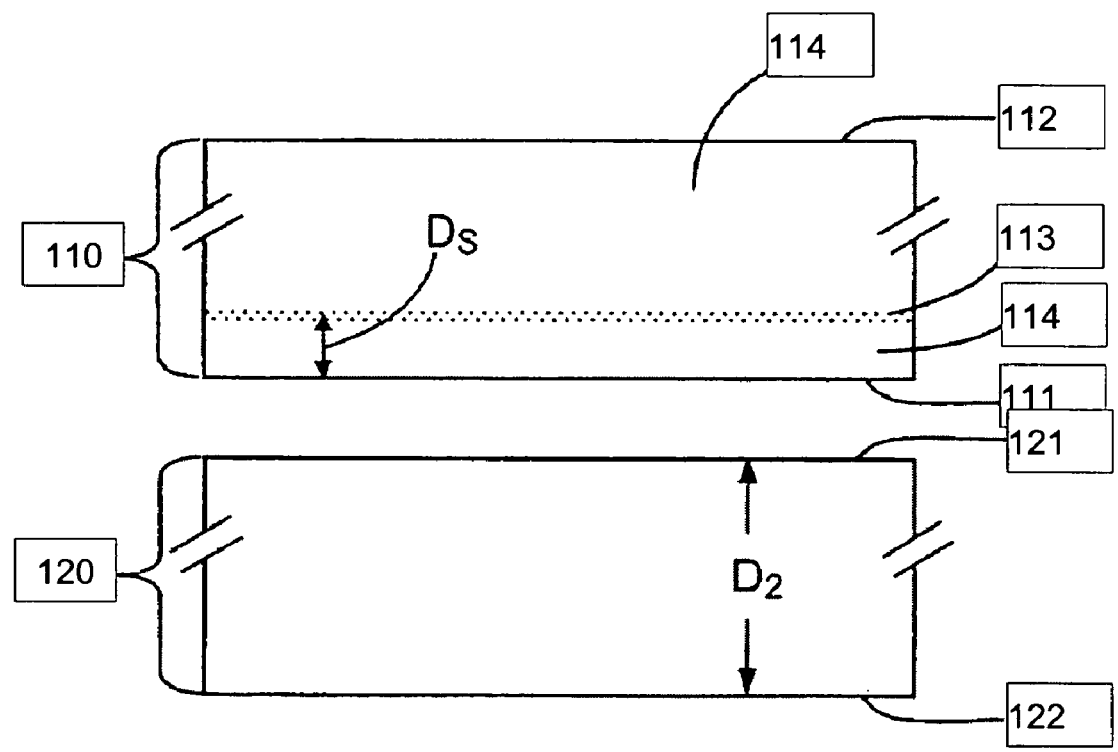
FIGS. 5-8 are schematic cross-sectional views of steps of a method for making a semiconductor-on-insulator structure according to one embodiment of the present invention.

Another embodiment of the invention is shown in cross-sectional schematic view in FIG. 4. Semiconductor-on-insulator structure 80 includes a first layer 82 and a second layer 84, substantially described above. Semiconductor-on-insulator structure 80 includes, in order, the semiconductor material (90); the semiconductor material with an enhanced oxygen content (92); the glass or glass-ceramic with a reduced positive ion concentration for at least one type of positive ion (94); the glass or glass-ceramic material with an enhanced positive ion concentration for at least one type of positive ion (96); and the glass or glass ceramic (98). Such a structure can be made using the methods described herein below and in U.S. patent application Ser. No. 10/779,582.

In certain desirable embodiments of the present invention, the glass or glass-ceramic of the second layer has a relatively low concentration of alkali ions. Desirably, the sum of the concentrations of lithium, sodium and potassium ions in the glass or glass-ceramic on an oxide basis is less than about 2 wt %. More desirably, the sum of the concentrations of lithium, sodium and potassium ions in the glass or glass-ceramic on an oxide basis is less than about 1 wt %. In certain especially desirable embodiments of the present invention, the sum of the concentrations of lithium, sodium and potassium ions in the glass or glass-ceramic on an oxide basis is less than about 0.1 wt %.

The methods described herein below and in U.S. patent application Ser. No. 10/779,582 allow the skilled artisan to make strained semiconductor-on-insulator structures of large size. For example, according to one embodiment of the present invention, a semiconductor-on-insulator structure as described herein has a maximum dimension no less than 10 cm.

The semiconductor-on-insulator structures of the present invention can be made with virtually any desirable layer thicknesses. For example, the first layer desirably has a thickness less than about 10 μm. More desirably, the first layer desirably has a thickness less than about 1 μm. In certain desirable embodiments of the invention, the first layer has a thickness between about 10 nm and 500 nm. The second layer desirably has a thickness between about 0.1 mm and about 10 mm. More desirably, the second layer has a thickness between about 0.5 mm and about 1 mm. For some applications of semiconductor-on-insulator structures, insulating layers having a thickness greater than or equal to 1 μm are desirable, e.g., to avoid parasitic capacitive effects which arise when standard semiconductor-on-insulator structures having a silicon/$SiO_2$/silicon configuration are operated at high frequencies. In the past, such thicknesses have been difficult to achieve. In accordance with one embodiment of the present invention, a semiconductor-on-insulator structure having an insulating layer thicker than 1 μm is readily achieved by simply using a second layer whose thickness is no less than 1 μm. A preferred lower limit on the thickness of the second substrate is thus 1 μm.

In general terms, the second layer needs to be thick enough to support the first layer through the process steps of the invention, as well as subsequent processing performed on the SOI structure. Although there is no theoretical upper limit on the thickness of the second substrate, a thickness beyond that needed for the support function or that desired for the ultimate SOI structure is generally not preferred since the greater the thickness of the second substrate, the lower the electric field strength within the substrate during step (C) of the method of the present invention for the same applied voltage difference.

The semiconductor-on-insulator structures of the present invention can be used in many types of semiconductor-based devices and end products. For example, according to one embodiment of the present invention, a thin film transistor includes a patterned element including the semiconductor-on-insulator structure as described above. According to another embodiment of the invention, a liquid crystal display includes a liquid crystalline material and a patterned element including a semiconductor-on-insulator structure as described hereinabove, desirably having a substantially transparent second layer. According to another embodiment of the invention, an OLED device includes a light-emitting organic material and a patterned element including a semi-conductor-on-insulator structure as described hereinabove, desirably having a substantially transparent second layer. As described in U.S. patent application Ser. No. 10/779,582, the skilled artisan can use conventional methods to make these devices.

Another embodiment of the present invention, shown in cross-sectional schematic view in FIGS. 5-8, relates to a method for producing a semiconductor-on-insulator structure, specifically, an SOG structure. In step (A) of the method, illustrated in FIG. 5, first and second substrates (110, 120) are provided, wherein:
(1) the first substrate (110) comprises a first external surface (111) for bonding to the second substrate (the first bonding surface), a second external surface (112) for applying force to the first substrate (the first force-applying surface), and an internal zone (113) for separating the first substrate into a first part (114) and a second part (115) (the internal zone (113) is hereinafter referred to as the "separation zone," which, for example, can be a hydrogen ion implantation zone), wherein:
  (a) the first bonding surface (111), the first force-applying surface (112), and the separation zone (113) are substantially parallel to one another;
  (b) the second part (115) is between the separation zone (113) and the first bonding surface (111); and
  (c) the first substrate (110) comprises a substantially single-crystal semiconductor material; and
(2) the second substrate (120) comprises two external surfaces (121, 122), one for bonding to the first substrate (the second bonding surface) and another for applying force to the second substrate (the second force-applying surface), wherein:
  (a) the second bonding surface (121) and the second force-applying surface (122) are substantially parallel to one another and are separated from one another by a distance $D_2$; and
  (b) the second substrate (120) comprises a glass or a glass-ceramic.

Figure 6:
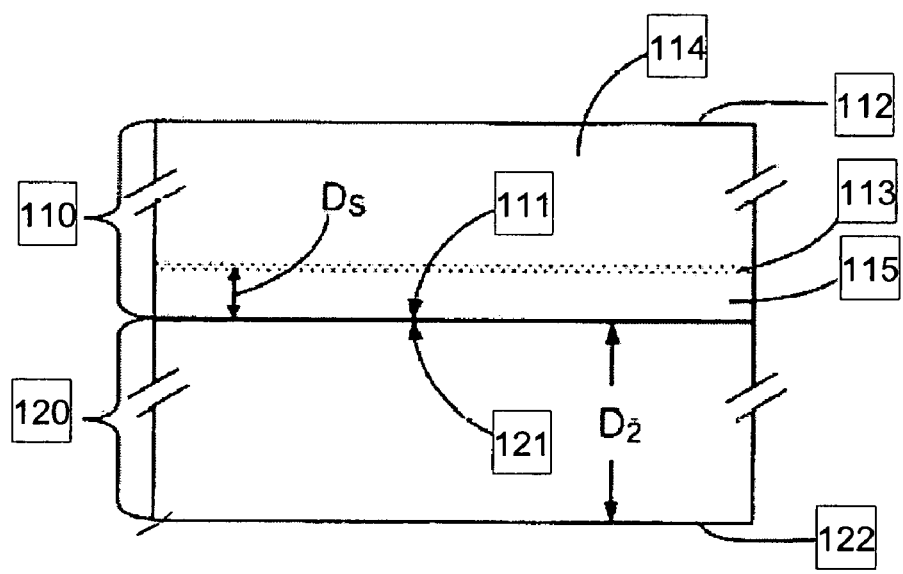

In step (B) of the method, shown in FIG. 6, the first and second bonding surfaces (111, 121) are brought into contact (once brought into contact, the first and second bonding surfaces form what is referred to herein as the "interface" between the first and second substrates).

Figure 7:
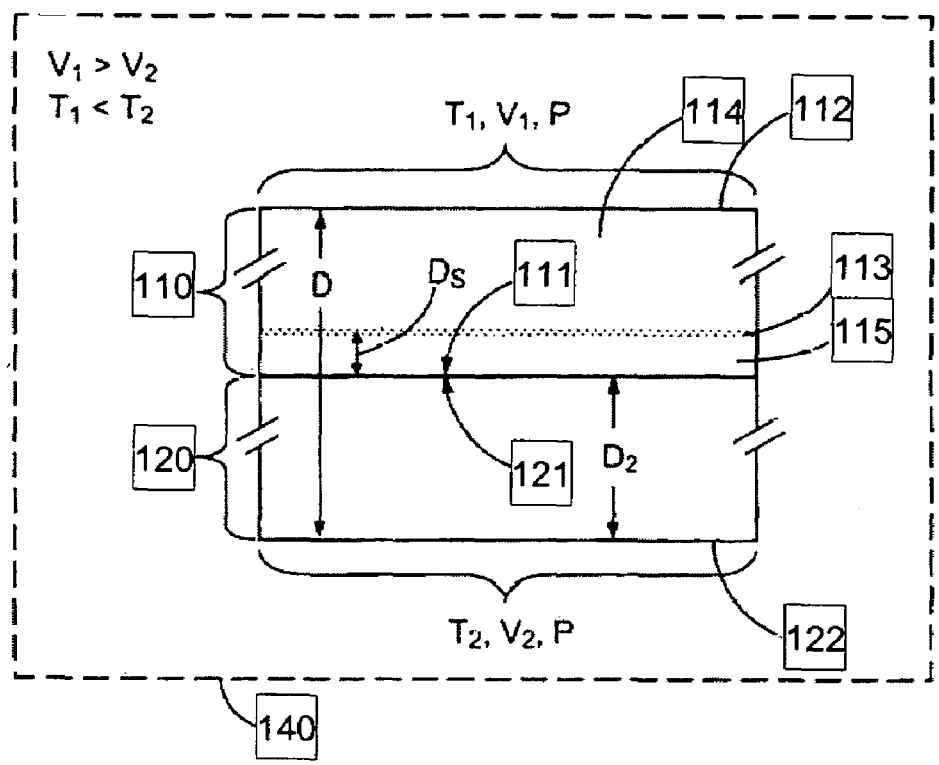

In step (C) of the method, shown in FIG. 7, for a period of time sufficient for the first and second substrates to bond to one another at the first and second bonding surfaces (i.e., at the interface), the following steps are substantially simultaneously performed:
(1) applying force to the first and second force-applying surfaces (112, 122) to press the first and second bonding surfaces (111, 121) together;
(2) subjecting the first and second substrates (110, 120) to an electric field which is characterized by first and second voltages $V_1$ and $V_2$ at the first and second force-applying surfaces (112, 122), respectively, said voltages being uniform at those surfaces with $V_1$ being higher than $V_2$ so that the electric field is directed from the first substrate (110) to the second substrate (120); and
(3) heating the first and second substrates (110, 120), said heating being characterized by first and second temperatures $T_1$ and $T_2$ at the first and second force-applying surfaces (112, 122), respectively, said temperatures being uniform at those surfaces and being selected so that upon cooling to a common temperature, the first and second substrates (110, 120) undergo differential contraction to thereby weaken the first substrate (110) at the separation zone (113).

Figure 8:
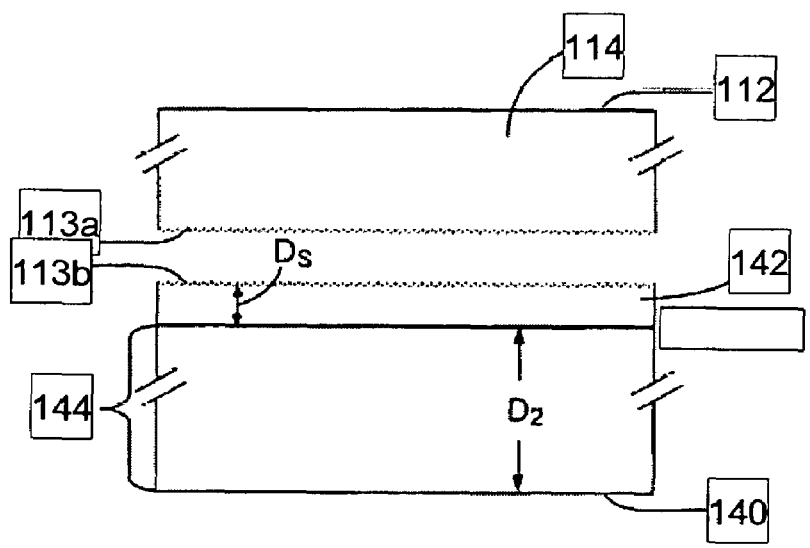

In step (D) of the method, shown in FIG. 8, the bonded first and second substrates (110, 120) are cooled to a common temperature (e.g., to a common temperature such as room temperature); and the first and second parts (114, 115) are separated at the separation zone (113a-b), thereby forming semiconductor-on-insulator structure 140 having a first layer 142 (arising from the first substrate 110) and a second layer 144 (arising from the second substrate 120).

The CTE of the glass or glass-ceramic and the CTE of the are desirably chosen such that the semiconductor material is under tensile strain at a use temperature. For example, the semiconductor material is desirably under tensile strain at 25° C., at 100° C., or over the temperature range from 25-100° C. The properties of the materials (CTE and otherwise) of the first and second substrates are desirably substantially as described hereinabove for the semiconductor-on-insulator structures of the present invention. For example, in desirable embodiments of the invention, the CTE(25-300° C.) of the glass or glass-ceramic is less positive than the CTE(25° C.) of the semiconductor material. In other desirable embodiments of the invention, the CTEs of the materials of the first layer and of the second layer are such that $$\int_{T_{use}}^{T_{bond}} CTE_{first\ layer}(T) - CTE_{second\ layer}(T)\, dT$$

is greater than zero for use temperatures of, for example, 25° C., 100° C., or the 25-100° C. temperature range.

According to one embodiment of the invention, the glass or glass-ceramic desirably has one or both of the following sets of characteristics:

(i) the glass or glass-ceramic has a strain point of less than 1,000° C. and comprises positive ions (e.g., alkali or alkaline-earth ions) which during step (C), move within the second substrate (120) in a direction away from the second bonding surface (121) and towards the second force-applying surface (122); and/or (ii) the glass or glass-ceramic comprises (a) non-bridging oxygens and (b) positive ions (e.g., alkali or alkaline-earth ions) which during step (C), move within the second substrate (120) in a direction away from the second bonding surface (121) and towards the second force-applying surface (122).

As known in the art, non-bridging oxygens in a glass or in the glass phase of a glass-ceramic are those oxygens contributed to the glass by non-network forming components of the glass. For example, in many glasses, the non-bridging oxygens include those oxygens which are part of the glass through the incorporation of alkaline-earth oxides (e.g., MgO, CaO, SrO, and/or BaO) in the glass composition.

Although not wishing to be bound by any particular theory of operation, it is believed that an electrolysis-type reaction takes place during step (C). In particular, it is believed that the semiconductor substrate (first substrate) serves as the positive electrode for the electrolysis-type reaction and that reactive oxygen is produced in the region of the interface between the first and second substrates. This oxygen is believed to react with the semiconductor material (e.g., silicon) forming, in situ, a hybrid region (116) of oxidized semiconductor (e.g., a silicon oxide region for a silicon-based semiconductor). This hybrid region begins at the interface and extends into the first substrate. The presence of non-bridging oxygens in the glass or glass-ceramic of the second substrate is believed to play a role in the generation of the oxygens that react with the semiconductor material of the first substrate.

It is believed that such generation of reactive oxygen and its combination with the semiconductor material is a source of the strong bond which the invention achieves between the semiconductor material of the first substrate and the glass or glass-ceramic of the second substrate, i.e., at least a part (and potentially all) of the bond between the first and second substrates is through the reaction of the semiconductor material with reactive oxygen originating from the second substrate. Significantly, unlike prior techniques, this strong bond is achieved without the need for a high temperature treatment, i.e., a treatment at a temperature above 1,000° C.

This ability to avoid high temperature processing allows the second substrate to be a material which can be manufactured in large quantities at low cost. That is, by eliminating high temperature processing, the invention eliminates the need for a support substrate composed of an expensive high temperature material, such as, silicon, quartz, diamond, sapphire, etc.

In particular, the ability to achieve a strong bond without the need for a high temperature treatment allows the second substrate to be composed of a glass or a glass-ceramic; in one embodiment the glass or glass-ceramic exhibits a strain point less than 1,000° C. More particularly, for display applications, the glass or glass-ceramic typically has a strain point less than 800° C., and in further embodiments less than 700° C. For electronics and other applications, the strain point is preferably less than 1,000° C. As well known in the glass making art, glasses and glass-ceramics having lower strain points are easier to manufacture than glasses and glass-ceramics having higher strain points.

To facilitate bonding, the glass or glass-ceramic should be able to conduct electricity at least to some extent. The conductivity of glasses and glass-ceramics depends on their temperature and thus in achieving a strong bond between the semiconductor material and the glass or glass-ceramic, there is a balance among: 1) the conductivity of the glass or glass-ceramic, 2) the temperatures ($T_1$ and $T_2$) used in step (C), 3) the strength of the electric field applied to the first and second substrates during step (C), and 4) the amount of time during which step (C) is performed.

As a general guideline, the glass or glass-ceramic preferably has a resistivity ρ at 250° C. that is less than or equal to $10^{16}$ Ω-cm (i.e., a conductivity at 250° C. that is greater than or equal to $10^{-16}$ Siemens/cm). More preferably, ρ at 250° C. is less than or equal to $10^{13}$ Ω-cm, and most preferably, it is less than or equal to $10^{11.5}$ Ω-cm. It should be noted that although quartz has the requisite resistivity at 250° C. of $10^{11.8}$ Ω-cm, it lacks positive ions that can move during step (C), and it thus follows that quartz is unsuitable for use as the second substrate in producing semiconductor-on-insulator structures in accordance with the above procedures.

For certain first substrate/second substrate combinations, pretreatment of the bonding surface 111 of first substrate 110 to reduce its hydrogen concentration has been found advantageous in achieving bonding of the second part 115 of the first substrate to second substrate 120. In particular, such a reduction in hydrogen concentration has been found to be of particular importance when transferring silicon films from silicon wafers implanted with hydrogen ions to glass substrates containing alkaline-earth ions. It is believed that a reduction in hydrogen concentration will also be advantageous for glass and glass ceramics having high strain points, e.g., in the 850° C. to 900° C. range, which are expected to be needed for RF applications in wireless and other electronics applications.

In particular, it has been found that after hydrogen ion implantation, the surface of an implanted silicon wafer has a high hydrogen concentration, e.g., a high hydrogen ion concentration. The hydrogen termination at the Si surface inhibits the bonding process and thus it has been found desirable to reduce the hydrogen concentration on the implanted Si wafer surface by using a gentle oxidizing treatment in order to obtain effective Si layer transfer to glass wafers of the foregoing types. Reduction in hydrogen concentration results in making the implanted silicon wafer more hydrophilic and allows the bonding to take place during the application of voltage and heat. The strong bond formed during the process allows uniform separation of the Si film from the mother wafer.

Quantitatively, it has been found that in the absence of a hydrogen reduction treatment, only about 10% of the glass wafer is covered with a Si film and even in the covered area, the Si film tends to be non-uniform. However, when the hydrogen concentration at the surface of the Si is reduced by an oxidizing treatment, a uniform Si film becomes attached to the glass wafer over its entire surface.

Various approaches can be used to reduce the hydrogen concentration on the surface of an implanted wafer. Preferred approaches involve a mild oxidation treatment of the surface, such as, treatment of the wafer with an oxygen plasma, treatment with hydrogen peroxide, hydrogen peroxide and ammonia, hydrogen peroxide and ammonia followed by hydrogen peroxide and an acid, or combinations of these processes. Treatment with an oxygen plasma is the preferred approach, especially in a commercial setting. Although not wishing to be bound by any particular theory of operation, it is believed that during these treatments, hydrogen terminated surface groups oxidize to hydroxyl groups, which in turn makes the surface of the silicon wafer hydrophilic. The treatment is preferably carried out at room temperature for the oxygen plasma and at a temperature between 25-100° C. for the ammonia+peroxide or ammonia+peroxide followed by acid+peroxide treatments.

Although the foregoing discussion has been in terms of silicon wafers, it is believed that reductions in hydrogen concentration will be advantageous for hydrogen-implanted semiconductor wafers composed of semiconductor materials other than silicon.

Turning to FIG. 6, this figure illustrates step (B) of the process of the invention in which the first and second substrates 110 and 120 are brought into contact at their bonding surfaces 111 and 121. In the preferred embodiments of the invention, the first and second substrates are heated prior to step (B), e.g., are heated so that force-applying surfaces 112 and 122 are at $T_1$ and $T_2$, respectively. In this way, differential expansion between the first and second substrates is avoided during the bonding process of step (C). Alternatively, the first and second substrates are not pre-heated prior to step (B), but are heated after bonding surfaces 111 and 121 have been brought into contact and before the beginning of step (C) and/or during the initial part of step (C) before substantial bonding has occurred. When pre-heating is performed, the bonding surfaces can be separated by spacers which are removed once the desired temperatures of the first and second substrates have been reached.

The processing chamber, which is shown schematically at 140 in FIG. 7, can have a variety of configurations. For experimental purposes, a bonder of the type sold by SÜSS MICROTEC of Munich, Germany, can be used as the processing chamber. The same equipment can be used for commercial applications, although equipment capable of simultaneously processing multiple first substrate/second substrate assemblies will generally be preferred.

Because the invention uses low to moderate temperatures, pressures, electric field strengths, and vacuum levels, the requirements which the processing chamber needs to satisfy are not demanding, which is another important advantage of the invention, i.e., the invention can be practiced with equipment which is both relatively inexpensive and widely available or easily fabricated for custom applications.

FIG. 7 shows the central step of the process, i.e., step (C), where the first and second substrates are bonded to one another. Step (C) is performed for a period of time sufficient for the first and second substrates to bond to one another at the first and second bonding surfaces. For example, step (C) can be performed for a period between 45 and 90 minutes. Shorter periods of time are, of course, generally preferred (e.g., times less than 30 minutes) and in a commercial setting, it is expected that the time required to perform step (C) can be reduced to a period of 5-15 minutes or less through the optimization of substrate materials, processing temperatures, and applied voltages.

Step (C) is preferably performed under moderate vacuum conditions, i.e., chamber 40 is evacuated while step (C) is performed. Preferably, the pressure in the chamber is less than or equal to 1 millibar, and most preferably, less than or equal to $10^{-3}$ millibars. Alternatively, step (C) can be performed in an inert atmosphere, such as, an atmosphere of argon, helium, or the like.

For any particular set of first and second substrates, persons skilled in the art will readily be able to determine suitable combinations of time, temperature, and field strength for step (C) from the present disclosure. In particular, such persons will be able to select combinations of these parameters which create a bond between the semiconductor and the glass or glass-ceramic which is strong enough for the semiconductor-on-insulator structure to withstand the various forces and environmental conditions to which it will be exposed during further processing and/or use.

The voltages $V_1$ and $V_2$ desirably satisfy the relationship: $100 \text{ V/cm} \leq (V_1 - V_2)/D \leq 40 \text{ kV/cm}$, where D is the sum of the thicknesses of the first substrate and the second substrate.

In addition to the above role in bonding, the electric field applied in step (C) also moves positive ions (cations) within the second substrate in a direction from the second substrate's bonding surface (the second bonding surface) towards its force-applying surface (the second force-applying surface). Such movement preferably forms a positive ion depletion region (123) which begins at the interface between the first and second substrates and extends into the second substrate, i.e., the positive ion depletion region begins at the second bonding surface and extends into the second substrate towards the second force-applying surface.

The formation of such a positive ion depletion region is especially desirable when the glass or glass-ceramic contains alkali ions, e.g., $Li^+$, $Na^+$, and/or $K^+$ ions, since such ions are known to interfere with the operation of semiconductor devices. Alkaline-earth ions, e.g., $Mg^{2+}$, $Ca^{2+}$, $Sr^{2+}$, and/or $Ba^{2+}$, can also interfere with the operation of semiconductor devices and thus the positive ion depletion region also preferably has reduced concentrations of these ions.

Significantly, it has been found that the positive ion depletion region once formed is stable over time even if the semiconductor-on-insulator structure is heated to an elevated temperature comparable to, or even to some extent higher than, that used in step (C). Having been formed at an elevated temperature, the positive ion depletion region is especially stable at the normal operating and formation temperatures of semiconductor-on-insulator structures.

These considerations ensure that alkali and alkaline-earth ions will not diffuse back from the glass or glass-ceramic into the semiconductor of the semiconductor-on-insulator structure during use or further device processing, which is an important benefit derived from using an electric field as part of the bonding process of step (C).

As with selecting the operating parameters to achieve a strong bond, the operating parameters needed to achieve a positive ion depletion region of a desired width and a desired reduced positive ion concentration for all of the positive ions of concern can be readily determined by persons skilled in the art from the present disclosure. When present, the positive ion depletion region is a characteristic feature of an semiconductor-on-insulator structure produced in accordance with the method aspects of the present invention.

In addition to the positive ion depletion region, the application of the electric field can also create "pile-up" regions for one or more of the mobile positive ions contained in the glass or glass-ceramic. When present, such regions are located at or near the side (edge) of the depletion region farthest from the interface between the first and second substrates. Within the pile-up region, the positive ion has a concentration above its bulk concentration. For example, when measured in atomic percent, the peak concentration of the positive ion in the pile-up region can be, for example, up to 5 times greater than the bulk concentration. Like the positive ion depletion region, such a pile-up region, when present, is a characteristic feature of an semiconductor-on-insulator structure produced in accordance with the method aspects of the present invention.

The temperatures of the first and second substrates during step (C), i.e., the values of $T_1$ and $T_2$, are chosen to perform the important function of weakening (e.g., fracturing) the semiconductor substrate (first substrate) at the separation zone so that the first substrate can be divided into first and second parts, the second part being bonded to the second substrate.

Although not wishing to be bound by any particular theory of operation, it is believed that the weakening of the semiconductor substrate at the separation zone primarily occurs as the bonded first and second substrates are cooled after step (C), e.g., to room temperature. By the proper selection of $T_1$ and $T_2$ (see below), this cooling causes the first and second substrates to differentially contract. This differential contraction applies stress to the first substrate which manifests itself as a weakening/fracturing of the first substrate at the separation zone. As discussed above, preferably, the differential contraction is such that the first substrate seeks to contract more than the second substrate.

The values of $T_1$ and $T_2$ used during step (C) will depend on the relative coefficients of thermal expansion of the first and second substrates, the goal in choosing these values being to ensure that one of the substrates, preferably, the first substrate, seeks to contract to a greater extent than the other substrate, preferably, the second substrate, so as to apply stress to, and thus weaken, the separation zone during cooling. For any particular application of the invention (e.g., any particular semiconductor material and any particular glass or glass-ceramic), persons skilled in the art will readily be able to select values for $T_1$ and $T_2$ based on the present disclosure which will provide a level of differential contraction sufficient to weaken the separation zone so that the first and second parts of the first substrate can be separated from one another to produce the desired SOI structure. In desirable embodiments of the invention, $T_1$, $T_2$ and the strain point $T_s$ of the glass or glass ceramic satisfy the relationships:

$$T_s - 350°\,C. \leq T_1 \leq T_s + 350°\,C.;\ \text{and}$$

$$T_s - 350°\,C. \leq T_2 \leq T_s + 350°\,C.$$

Desirably, both $T_1$ and $T_2$ are between 300° C. and 1000° C. In certain desirable embodiments of the invention, both $T_1$ and $T_2$ are between 300° C. and 800° C.

As discussed in further detail below in connection with FIG. 8, separation of the first and second parts at the separation zone results in each part having an "exfoliation" surface where the separation occurred. As known in the art, upon initial formation, i.e., before any subsequent surface treatments, such an exfoliation surface is characterized by a surface roughness which is generally at least on the order of 0.5 nanometers RMS, e.g., in the range of 1-100 nanometers, and depending on the process conditions used, will typically have a concentration of the implanted ion used to form the separation zone, e.g., hydrogen, above that present in the body of the first or second parts. The exfoliation surface as initially formed will also be characterized by a distorted crystal structure as seen by TEM. In typical applications, the exfoliation surface is polished prior to use so that its RMS surface roughness is reduced to 1 nanometer or less, e.g., to a RMS surface roughness on the order of 0.1 nanometers for electronic applications. As used herein, the phrase "exfoliation surface" includes the surface as initially formed and the surface after any subsequent treatments.

Separation zone 113 is formed using implantation/exfoliation techniques of the type currently known to those skilled in the art or which may be developed in the future. At present, the separation zone is preferably formed using the hydrogen ion implantation techniques of the references discussed above, the relevant portions of which are hereby incorporated by reference. Other currently-known techniques can also be used to form the separation zone, such as, co-implantation of hydrogen and helium ions or hydrogen and boron ions. Whatever technique is chosen, the first substrate needs to be separable into the first and second parts at the separation zone during step (D). Thus, the separation zone needs to respond to the heat treatment/cooling process by becoming weaker so that the division of the first substrate into the first and second parts can occur.

The pressure applied to the first and second substrates during step (C) ensures that those substrates are in intimate contact while undergoing the heat and electric field treatments of that step. In this way, strong bonding between the substrates can be achieved.

Generally, the semiconductor substrate (the first substrate) will be able to withstand higher levels of applied pressure than the glass or glass-ceramic substrate (the second substrate). Thus, the pressure is chosen to provide intimate contact between the substrates without damaging the second substrate.

A wide range of pressures can be used. For example, the force per unit area P applied to the first and second force-applying surfaces of the first and second substrates, respectively, preferably satisfies the relationship:

$$1\ \text{psi} \leq P \leq 100\ \text{psi};$$

and most preferably, the relationship:

$$1\ \text{psi} \leq P \leq 50\ \text{psi}.$$

Again, the specific pressure value to be used for any particular application of the invention can be readily determined by persons skilled in the art from the present disclosure.

The invention can be practiced using a single first substrate and a single second substrate. Alternatively, the methods of the invention can be used to form more than one SOI structure on a single second substrate.

For example, steps (A) through (D) can be used to form a first SOI structure which does not cover the entire area of the second substrate. Thereafter, steps (A) through (D) can be repeated to form a second SOI structure which covers all or part of the area not covered by the first SOI structure. The second SOI structure may be the same or different from the first SOI structure, e.g., the second SOI structure can be made using a first substrate composed of a substantially single-crystal semiconductor material that is the same or different from the semiconductor material of the first substrate used in producing the first SOI structure.

More preferably, multiple SOI structures are formed simultaneously on a single second substrate by providing multiple (i.e., two or more) first substrates in step (A), bringing all of those first substrates into contact with a single second substrate in step (B), and then performing steps (C) and (D) on the resulting multiple first substrate/single second substrate assembly. The multiple first substrates provided in step (A) can all be the same, all different, or some the same and some different.

Whichever approach is used, the resulting multiple SOI structures on a single glass or glass-ceramic substrate can be contiguous or separated as appropriate for the particular application of the invention. If desired, gaps between some or all of the adjacent structures can be filled with, for example, semiconductor material to obtain one or more continuous semiconductor layers on a glass or glass-ceramic substrate of any desired size.

EXAMPLE

The present invention is further described by the following non-limiting example.

Example

A 100 mm diameter, 1 mm thick wafer of glass 3N of Table 3 was polished to smoothness. A silicon wafer 525 μm in thickness was implanted with hydrogen at 100 keV and an ion dosage of $8 \times 10^{16}$ ions/cm$^2$ was cleaned with detergent and distilled water followed by a 10% nitric acid wash, and brought into contact with the glass wafer in a SUSS MICROTEC bonder. The glass wafer was heated at 450° C. and the silicon wafer at 400° C. in vacuum, and 10 psi pressure and 1750 V potential difference (glass at ground, silicon wafer at 1750 V) was applied for five minutes. While under the same potential difference and pressure, the glass wafer was heated at 575° C. and the silicon wafer at 525° C. for ten minutes, after which time the potential difference and pressure were removed, and the bonded wafers allowed to cool down. The cooled wafers separated into a silicon-on-glass wafer with a thin silicon layer, and a silicon wafer. The silicon layer on the glass had a thin, damaged top layer, and an undamaged single-crystal silicon bottom layer. The thin damaged layer can be polished or etched off to obtain the desired silicon-on-glass wafer.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A semiconductor-on-insulator structure comprising:
   first and second layers which are attached to one another either directly or through one or more intermediate layers, wherein
   the first layer comprises a substantially single crystal semiconductor material;
   the second layer comprises a glass or a glass-ceramic, having: (i) first and second substantially parallel faces separated by a distance D2, the first face being closer to the first layer than the second face; (ii) a reference surface which 1) is within the second layer, 2) is substantially parallel to the first face, and 3) is separated from that face by a distance D2/2; (iii) positive ions of one or more types, each type of positive ion having a reference concentration Ci/Ref at the reference surface; and (iv) a region (a positive ion depletion region) which begins at the first face and extends toward the reference surface in which the concentration of at least one type of positive ion is depleted relative to the reference concentration Ci/Ref for that ion; and
   the CTE(25-300° C.) of the glass or glass-ceramic is less positive than the CTE(25° C.) of the semiconductor material.

2. The semiconductor-on-insulator structure of claim 1, wherein the CTE(25-300° C.) of the glass or glass-ceramic is at least $3 \times 10^{-7}$/° C. less positive than the CTE(25° C.) of the semiconductor material.

3. The semiconductor-on-insulator structure of claim 1, wherein the CTE(25-300° C.) of the glass or glass-ceramic is at least $5 \times 10^{-7}$/° C. less positive than the CTE(25° C.) of the semiconductor material.

4. The semiconductor-on-insulator structure of claim 1, wherein the first layer is under tensile strain at 25° C.

5. The semiconductor-on-insulator structure of claim 1, wherein the first layer has a bulk mobility that is at least about 105% of the bulk mobility of the semiconductor material in a substantially unstrained state.

6. The semiconductor-on-insulator structure of claim 1, wherein the glass or glass-ceramic has a strain point of less than 1050° C.

7. The semiconductor-on-insulator structure of claim 1, wherein the semiconductor material is a silicon-based semiconductor material.

8. The semiconductor-on-insulator structure of claim 1, wherein the glass or glass-ceramic has a CTE(25-300° C.) of no more positive than about $22 \times 10^{-7}$/° C.

9. The semiconductor-on-insulator structure of claim 1, wherein the glass or glass-ceramic has a CTE(25-300° C.) of no more positive than about $20 \times 10^{-7}$/° C.

10. The semiconductor-on-insulator structure of claim 1, wherein the difference between the CTE(25° C.) of the semiconductor material and the CTE(25-300° C.) of the glass or glass-ceramic is no greater than about $30 \times 10^{-7}$/° C.

11. The semiconductor-on-insulator structure of claim 1, wherein the glass or glass-ceramic is selected from the group consisting of a aluminosilicate glass; a borosilicate glass; an aluminoborosilicate glass; and a rare earth aluminosilicate glass.

12. The semiconductor-on-insulator structure of claim 1, wherein the glass or glass-ceramic is an aluminum phosphorus silicate glass.

13. The semiconductor-on-insulator structure of claim 1, wherein the glass or glass-ceramic includes alkali ions or alkali earth ions.

14. The semiconductor-on-insulator structure of claim 1, wherein the glass or glass-ceramic is a glass-ceramic having a spinel, β-quartz, or β-spodumene crystal phase.

15. The semiconductor-on-insulator structure of claim 1, wherein the first layer was bonded to the second layer at a temperature $T_{bond}$, and wherein the semiconductor-on-insulator structure has a use temperature $T_{use}$, and wherein $$\int_{T_{use}}^{T_{bond,}} CTE_{first\ layer}(T) - CTE_{second\ layer}(T)\,dT$$

is greater than zero.

16. The semiconductor-on-insulator structure of claim 1, wherein the first layer was bonded to the second layer at a temperature Tbond, and wherein $$\int_{25°C.}^{T_{bond,}} CTE_{first\ layer}(T) - CTE_{second\ layer}(T)\,dT$$

is greater than zero.

17. The semiconductor-on-insulator structure of claim 1, wherein the bond strength between the first and second layers is at least 8 J/m².

18. The semiconductor-on-insulator structure of claim 1, wherein:
the region which begins at the first face and extends toward the reference surface has a distal edge, and
the second layer further has (v) a region (the pile-up region) in the vicinity of the distal edge in which the concentration of at least one type of positive ion is enhanced relative to $C_{i/Ref}$ for that ion.

19. The semiconductor-on-insulator structure of claim 1, wherein the glass or the glass-ceramic comprises, and the positive ion depletion region is depleted of one or more of the alkali ions and the alkaline earth ions.

20. The semiconductor-on-insulator structure of claim 1, wherein the glass or the glass-ceramic comprises positive ions of one or more types, wherein the sum of lithium, sodium and potassium ions in the glass or glass-ceramic on an oxide basis is less than about 2 weight percent.

21. The semiconductor-on-insulator structure of claim 1, wherein the first layer has a maximum dimension greater than 10 cm.

22. The semiconductor-on-insulator structure of claim 1, wherein at least part of the structure comprises, in order:
the semiconductor material;
the semiconductor material with an enhanced oxygen content;
the glass or glass ceramic material with a reduced positive ion concentration for at least one type of positive ion;
the glass or glass ceramic material with an enhanced positive ion concentration for at least one type of positive ion; and
the glass or glass ceramic.

23. The semiconductor-on-insulator structure of claim 1, wherein the first layer has a thickness of no greater than about 10 μm.

24. A liquid crystal display comprising a patterned display element including the semiconductor-on-insulator structure of claim 1.

25. A thin film transistor comprising a patterned element comprising the semiconductor-on-insulator structure of claim 1.

26. A semiconductor-on-insulator structure comprising:
first and second layers which are attached to one another either directly or through one or more intermediate layers, wherein:
the first layer comprises a substantially single crystal semiconductor material;
the second layer comprises a glass or a glass-ceramic;
the semiconductor-on-insulator structure has a use temperature $T_{use}$, such that the following expression is true:

$$\int_{T_{use}}^{T_{bond,}} CTE_{first\ layer}(T) - CTE_{second\ layer}(T)\,dT$$

is greater than zero.

27. The semiconductor-on-insulator structure of claim 26, wherein $$\int_{T_{use}}^{T_{bond,}} CTE_{first\ layer}(T) - CTE_{second\ layer}(T)\,dT$$

is greater than $1 \times 10_{-4}$.

28. The semiconductor-on-insulator structure of claim 26, wherein $$\int_{25°C.}^{T_{bond,}} CTE_{first\ layer}(T) - CTE_{second\ layer}(T)\,dT$$

is greater than zero.

29. The semiconductor-on-insulator structure of claim 26, wherein $$\int_{25°C.}^{T_{bond,}} CTE_{first\ layer}(T) - CTE_{second\ layer}(T)\,dT$$

is greater than $1 \times 10_{-4}$.

30. A method for producing a semiconductor-on-insulator structure comprising:
(A) providing first and second substrates wherein:
(1) the first substrate comprises a first external surface for bonding to the second substrate (the first bonding surface), a second external surface for applying force to the first substrate (the first force-applying surface), and an internal zone for separating the first substrate into a first part and a second part (the separation zone), wherein:
(a) the first bonding surface, the first force-applying surface, and the separation zone are substantially parallel to one another;
(b) the second part is between the separation zone and the first bonding surface; and
(c) the first substrate comprises a substantially single-crystal semiconductor material; and
(2) the second substrate comprises two external surfaces, one for bonding to the first substrate (the second bonding surface) and another for applying force to the second substrate (the second force-applying surface), wherein:
(a) the second bonding surface and the second force-applying surface are substantially parallel to one another and are separated from one another by a distance D2; and (b) the second substrate comprises a glass or a glass-ceramic;
(B) bringing the first and second bonding surfaces into contact;
(C) for a period of time sufficient for the first and second substrates to bond to one another at the first and second bonding surfaces, simultaneously:
  (1) applying force to the first and second force-applying surfaces to press the first and second bonding surfaces together;
  (2) subjecting the first and second substrates to an electric field which is characterized by first and second voltages $V_1$ and $V_2$ at the first and second force-applying surfaces, respectively, said voltages being uniform at those surfaces with $V_1$ being higher than $V_2$ so that the electric field is directed from the first substrate to the second substrate; and
  (3) heating the first and second substrates, said heating being characterized by first and second temperatures $T_1$ and $T_2$ at the first and second force-applying surfaces, respectively, said temperatures being uniform at those surfaces and being selected so that upon cooling to a common temperature, the first and second substrates undergo differential contraction to thereby weaken the first substrate at the separation zone; and
(D) cooling the bonded first and second substrates and separating the first and second parts at the separation zone, wherein $T_1$, $T_2$, the CTE of the semiconductor material and the CTE of the glass or glass-ceramic material are chosen such that the semiconductor material is under tensile strain at 25° C.

31. The method of claim 30, wherein the CTE(25-300° C.) of the glass or glass-ceramic is less positive than the CTE(25° C.) of the semiconductor material.

32. The method of claim 30, wherein:
the semiconductor-on-insulator structure has a use temperature $T_{use}$, such that the following expression holds true:

$$\int_{T_{use}}^{T_{bond}} CTE_{first\ layer}(T) - CTE_{second\ layer}(T)\,dT$$

is greater than zero.

33. The method of claim 30, wherein the glass or glass-ceramic comprises positive ions which during step (C), move within the second substrate in a direction away from the second bonding surface and towards the second force-applying surface.

34. The method of claim 30, wherein the glass or glass ceramic comprises non-bridging oxygens which during step (C), move within the second substrate in a direction away from the second bonding surface and towards the second force-applying surface.

35. The method of claim 30, wherein during step (C), the first and second substrates, at least in part, bond to one another through the reaction of the semiconductor material of the first substrate with oxygen atoms originating from the second substrate.

36. The method of claim 30, wherein the separation zone is formed by hydrogen ion implantation.

37. The method of claim 30, wherein $V_1$ and $V_2$ satisfy the relationship: 100 V/cm $\leq (V_1-V_2)/D \leq$ 40 kV/cm, where D is the sum of the thicknesses of the first substrate and the second substrate.

38. The method of claim 30, wherein $T_1$, $T_2$ and the strain point Ts of the glass or glass-ceramic satisfy the relationships: Ts-350° C.$\leq$T1 $\leq$Ts+350° C.; and Ts-350° C.$\leq T_2 \leq$Ts+350° C.

39. The method of claim 30, wherein 300° C.$\leq$T1$\leq$1000° C.; and 300° C.$\leq T_2 \leq$1000° C.

40. A semiconductor-on-insulator structure comprising:
first and second layers which are attached to one another either directly or through one or more intermediate layers, wherein
  the first layer comprises a substantially single crystal semiconductor material;
  the second layer comprises a glass or a glass-ceramic comprising positive ions of one or more types, wherein a sum of lithium, sodium and potassium ions in the glass or glass-ceramic on an oxide basis is less than about 2 weight percent; and
  the CTE(25-300° C.) of the glass or glass-ceramic is less positive than the CTE(25° C.) of the semiconductor material.

41. A semiconductor-on-insulator structure comprising first and second layers
which are attached to one another either directly or through one or more intermediate layers, wherein
  the first layer comprises a substantially single crystal semiconductor material;
  the second layer comprises a glass or a glass-ceramic; and
  at least part of the structure comprises, in order:
  the semiconductor material;
  the semiconductor material with an enhanced oxygen content;
  the glass or glass ceramic material with a reduced positive ion concentration for at least one type of positive ion;
  the glass or glass ceramic material with an enhanced positive ion concentration for at least one type of positive ion; and
  the glass or glass ceramic.

42. A semiconductor-on-insulator structure comprising first and second layers
which are attached to one another either directly or through one or more intermediate layers, wherein:
  the first layer comprises a substantially single crystal semiconductor material;
  the second layer comprises a glass or a glass-ceramic; and
  the first layer was bonded to the second layer at a temperature $T_{bond}$, and wherein the semiconductor-on-insulator structure has a use temperature $T_{use}$, such that the following expression holds true:

$$\int_{T_{use}}^{T_{bond}} CTE_{first\ layer}(T) - CTE_{second\ layer}(T)\,dT$$

is greater than zero.

* * * * *